United States Patent [19]

Noguchi et al.

[11] Patent Number: 5,608,770

[45] Date of Patent: Mar. 4, 1997

[54] FREQUENCY CONVERTER OUTPUTTING A CLOCK SIGNAL HAVING A STABLE AND ACCURATE FREQUENCY

[75] Inventors: Kouichi Noguchi, Machida; Eiichi Sasaki, Sagamihara, both of Japan

[73] Assignee: Ricoh Company, Ltd., Tokyo, Japan

[21] Appl. No.: 305,896

[22] Filed: Sep. 14, 1994

[30] Foreign Application Priority Data

Sep. 21, 1993 [JP] Japan .................................. 5-235067

[51] Int. Cl.$^6$ ........................... H03K 21/00; G01F 23/28
[52] U.S. Cl. .................. 377/47; 377/26; 377/39; 377/52
[58] Field of Search ................... 377/47, 26, 55, 377/24.1, 39, 52

[56] References Cited

U.S. PATENT DOCUMENTS 4,251,779  2/1981  Kellogg et al. .
4,947,410  8/1990  Lippmann et al. ................... 377/26

FOREIGN PATENT DOCUMENTS 4372224  12/1992  Japan .................................. 377/52
2015837   9/1979  United Kingdom .
2038579   7/1980  United Kingdom .

*Primary Examiner*—Margaret Rose Wambach
*Attorney, Agent, or Firm*—Oblon, Spivak, McClelland, Maier & Neustadt, P.C.

[57] ABSTRACT

A frequency converter is provided of which a frequency-dividing ratio is arbitrarily altered and retained after a power is turned off. The frequency converter has a programmable counter which outputs a signal having a desired frequency, a non-volatile memory for storing data for setting the frequency-dividing ratio and a control unit for controlling a writing operation of data stored into the non-volatile memory. The programmable counter, the non-volatile memory and the control unit are accommodated in a single package. The frequency converter may comprise a resonator and an oscillating circuit within the package so that the frequency converter can be treated as a single frequency generator such as a quartz-crystal oscillator.

10 Claims, 4 Drawing Sheets

5,608,770

FREQUENCY CONVERTER OUTPUTTING A CLOCK SIGNAL HAVING A STABLE AND ACCURATE FREQUENCY

BACKGROUND OF THE INVENTION

The present invention generally relates to a frequency converter, and more particularly to a frequency converter which outputs a clock signal having a stable and accurate frequency.

Such a frequency converter is used for generating a reference clock signal of a phase-locked loop (PLL) circuit widely used for controlling a rotational speed of a stepping motor, generating a synchronous signal for a communication system and generating a synchronous signal for a digital signal processing system.

Conventionally, a quartz-crystal resonator is used for constructing a system requiring a highly accurate and stable frequency, which quartz-crystal resonator oscillates at a specific frequency required by the system. For example, in a personal computer, a quartz-crystal resonator having a specific frequency such as 16 MHz, 20 MHz or 33 MHz is used according to a performance of a microprocessor used in the personal computer. A quartz-crystal resonator having a specific frequency is also used for a microcontroller widely used in an industrial field.

In an application which does not require a highly accurate and stable frequency, a ceramic resonator is used instead of the quartz-crystal resonator. The quartz-crystal resonator is also used for communication apparatus.

Generally, in the above-mentioned applications, particular frequencies are mostly used, and thus quartz-crystal resonators having specific frequencies are commercially available.

In a case where one quartz-crystal resonator is used for a clock signal having a specific frequency and when a different clock signal other than the specific frequency is needed, the different clock signal can be obtained by means of frequency conversion performed on the clock signal having the specific frequency. The frequency conversion is generally performed by a counter. For example, a programmable counter No. 8253 is widely used for generating a clock signal having a different frequency. Data for setting an operational mode and data for a frequency-dividing ratio are input to the programmable counter, and a clock signal used in a CPU is also input to the programmable counter so that a clock signal having a different frequency but the same accuracy and stability as the clock signal supplied by the CPU is obtained. Of course, a different clock signal for a processing unity which is not associated with the CPU or for a local communication may be generated by using another oscillator exclusively used for such applications.

When an accurate rotation of a motor is required, a PPL control system is widely used. In the PPL control system, the rotation of a motor is controlled so that an output of an encoder connected to a shaft of the motor synchronizes with an output of an oscillator using a quartz-crystal resonator. The motor controlled by the PPL control system is used as a drive motor in various apparatuses which require an accurate rotational speed. Those apparatuses include a hard disk drive, a floppy disk drive, a driving unit of a photo-sensitive drum of a printer or a copy machine, a driving unit of a polygon mirror of a laser scanner and a card feeder of a magnetic card reader. These apparatuses require a specific rotational speed of a motor, and thus various quartz-crystal resonators each having different frequencies are used.

As mentioned above, various quartz-crystal resonators other than that having standard frequencies are needed for various applications. Accordingly, it may take a long time to obtain a quartz-crystal resonator having a special frequency. Additionally, when a number of the resonators to be manufactured in a lot is small, a manufacturing cost per one resonator is increased.

SUMMARY OF THE INVENTION

It is a general object of the present invention to provide an improved and useful frequency converter which eliminates the above-mentioned problems.

More specific object of the present invention is to provide a frequency converter of which a frequency-dividing ratio is arbitrarily altered so as to obtain a desired frequency.

Another object of the present invention is to provide a frequency converter in which a frequency-dividing ratio is retained after a power is turned off.

Another object of the present invention is to provide a frequency converter which can be treated as a single frequency generator such as a quartz-crystal oscillator.

In order to achieve the above-mentioned objects, there is provided according to one aspect of the present invention a frequency converter comprising:

a programmable counter which outputs a signal having a desired frequency by dividing a frequency of an input signal by a frequency-dividing ratio;

a non-volatile memory, connected to the programmable counter, for storing data for setting the frequency-dividing ratio used by the programmable counter;

a control unit, connected to the non-volatile memory, for controlling a writing operation of data stored into the non-volatile memory; and a package for accommodating the programmable counter, the non-volatile memory and the control unit.

Additionally, there is provided according to another aspect of the present invention a frequency converter comprising:

a programmable counter which outputs a signal having a first frequency by dividing a frequency of an input signal by a frequency-dividing ratio;

a non-volatile memory, connected to the programmable counter, for storing data for setting the frequency-dividing ratio used by the programmable counter;

a control unit, connected to said non-volatile memory, for controlling a writing operation of data stored into the non-volatile memory;

a frequency synthesizer which generates a signal having a desired frequency; and a package for accommodating the programmable counter, the non-volatile memory, the control unit, and the frequency synthesizer.

Additionally, the frequency converter according to the present invention may comprise a resonator and an oscillating circuit within the package, the resonator and oscillating circuit together generating a signal having a predetermined frequency to be input to the programmable counter.

Other objects, features and advantages of the present invention will become more apparent from the following detailed description when read in conjunction with the accompanying drawings.

DETAILED DESCRIPTION OF THE PREFERRED EMBODIMENTS

Figure 1:
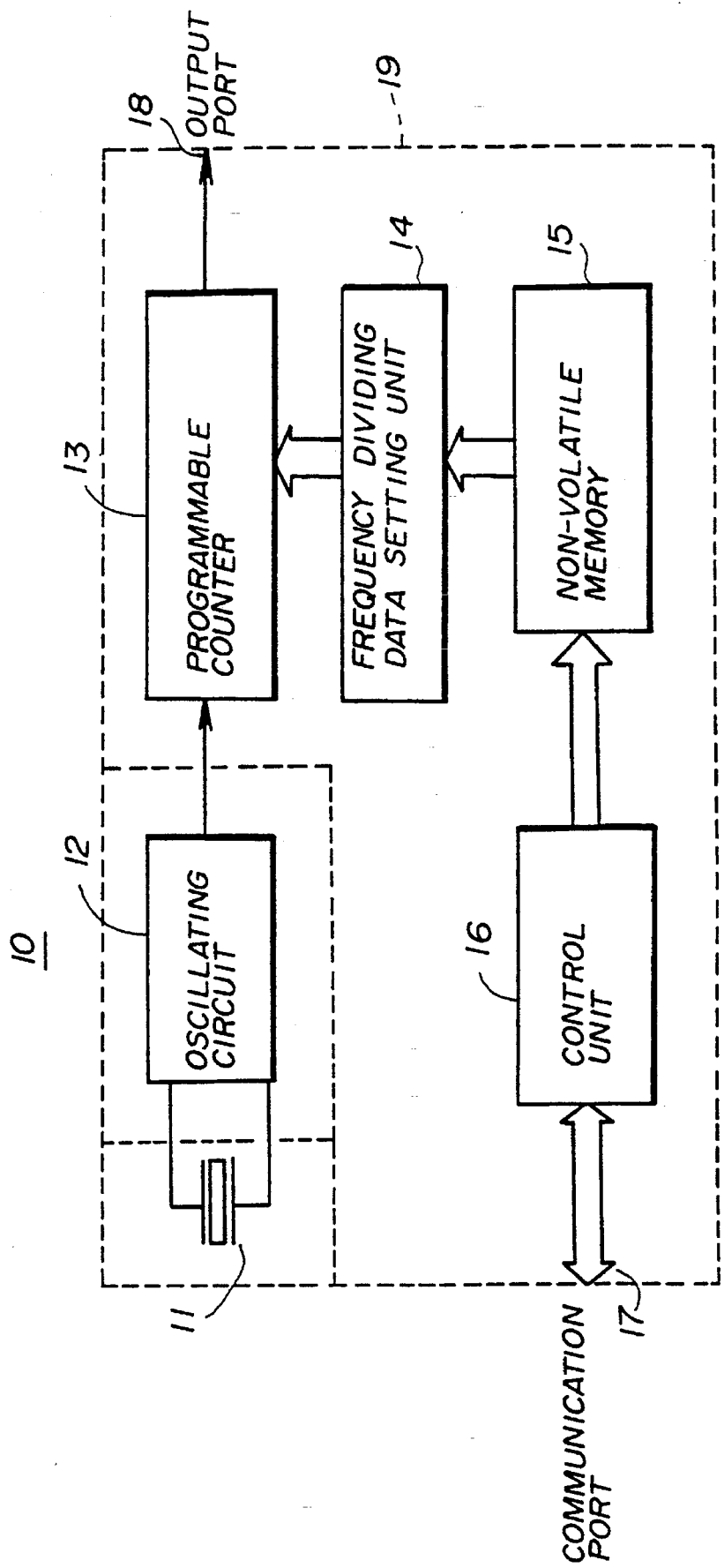
FIG. 1 is a block diagram of a first embodiment of a frequency converter according to the present invention.

A description will now be given, with reference to FIG. 1, of a first embodiment of the present invention. FIG. 1 is a block diagram of a first embodiment of a frequency converter according to the present invention.

As shown in FIG. 1, the frequency converter 10 according to the present invention comprises an oscillator 11, an oscillating circuit 12, a programmable counter 13, a frequency-dividing data-setting unit 14, a non-volatile memory 15, a control unit 16, a communication port 17 and an output port 18. These parts are accommodated in a single package 19. The resonator 11 may be a quartz-crystal resonator or a ceramic resonator. The resonator 11 and the oscillating circuit 12 may be provided separately from other parts.

The resonator 11 and the oscillating circuit 12 together oscillate at a predetermined frequency f. A signal having the frequency f is input to the programmable counter 13.

The control unit 16 writes data for setting a frequency-dividing ratio provided to the frequency-dividing data-setting unit 14 in accordance with commands and data received from an external device via the communication port 17 which is adapted to perform a serial communication. The frequency-dividing data-setting unit 14 sets the frequency-dividing data to the programmable counter 13. The programmable counter 13 processes the signal input from the oscillating circuit 12 according to the frequency-dividing data input from the frequency-dividing data-setting unit 14, and outputs a processed signal having a desired frequency to the output port 18. For example, if an integer N is set as the frequency-dividing data, a signal having a frequency f/N is output to the output port 18. It should be noted that the frequency-dividing data-setting unit 14 sets the frequency-dividing data each time a power is turned on.

In this embodiment, resolution of the frequency of the signal output from the programmable counter is obtained by dividing the frequency of the signal output from the oscillating circuit 12 by the maximum frequency-dividing ratio which can be set in the programmable counter 13. Accordingly, in order to obtain high resolution, the maximum frequency-dividing ratio must be increased. However, if the maximum frequency-dividing ratio is increased, the frequency of the signal output from the programmable counter 13 is decreased. Therefore, this embodiment is suitable for a field in which a relatively low frequency is required. Such a field is, for example, a synchronous clock signal used in a PPL control system for a brushless motor of which rotation requires a high accuracy.

In this embodiment, the frequency-dividing ratio can be changed by using a rewritable memory such as the non-volatile memory 15. If the resonator 11 and the oscillating circuit 12 are provided separately, the frequency of the signal output from the programmable counter 13 can be varied by changing the frequency of the signal input to the programmable counter 13 by exchanging the resonator 11 with a different one. A wide range of frequencies of the signal output from the frequency converter 10 can be obtained by changing the frequency-dividing ratio and exchanging the resonator 11.

In this embodiment, since the non-volatile memory is used for storing the frequency-dividing data, the input frequency-dividing data is retained while the power is off, and is set to the programmable counter 13 when the power is turned on. Accordingly, the frequency converter 10 can be treated in the same manner as a quartz-crystal oscillator having a specific frequency. Therefore, it is not necessary to manufacture a quartz-crystal resonator for each application.

In the above-mentioned first embodiment, a package used for a quartz-crystal oscillator or a package used for an IC device or an LSI device may be used as the package 19.

Figure 2:
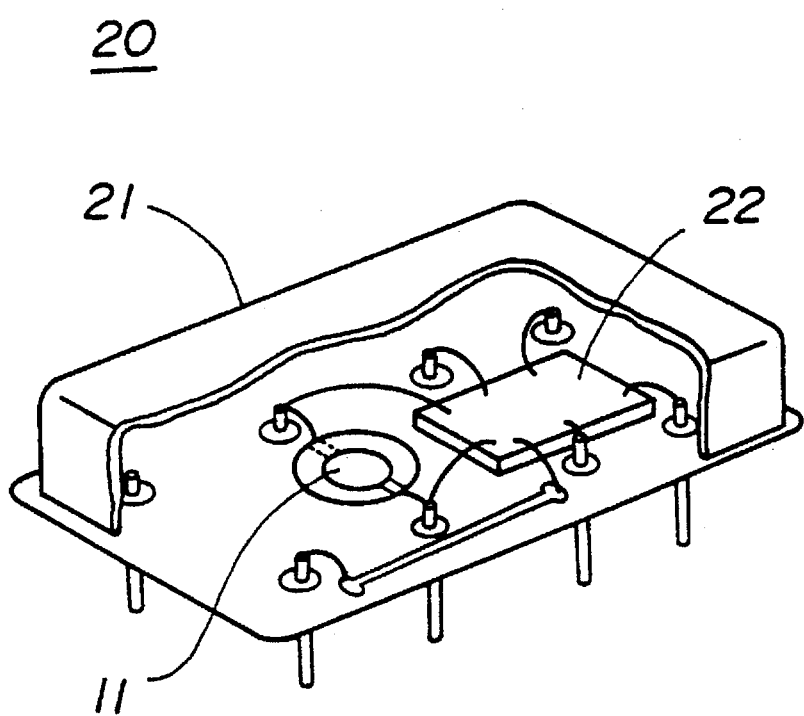
FIG. 2 is a perspective view of the frequency converter shown in FIG. 1 formed in a quartz-crystal package.

FIG. 2 shows a perspective view of a frequency converter 20 according to the above-mentioned first embodiment formed in a package used for a quartz-crystal oscillator. The frequency converter 20 comprises the quartz-crystal 11 and a circuit unit 22. The circuit unit 22 comprises all the circuit parts shown in FIG. 1. The quartz-crystal resonator 11 and the circuit unit 22 are accommodated in a case 21 which is identical to a package of an ordinary quartz-crystal oscillator.

Figure 3:
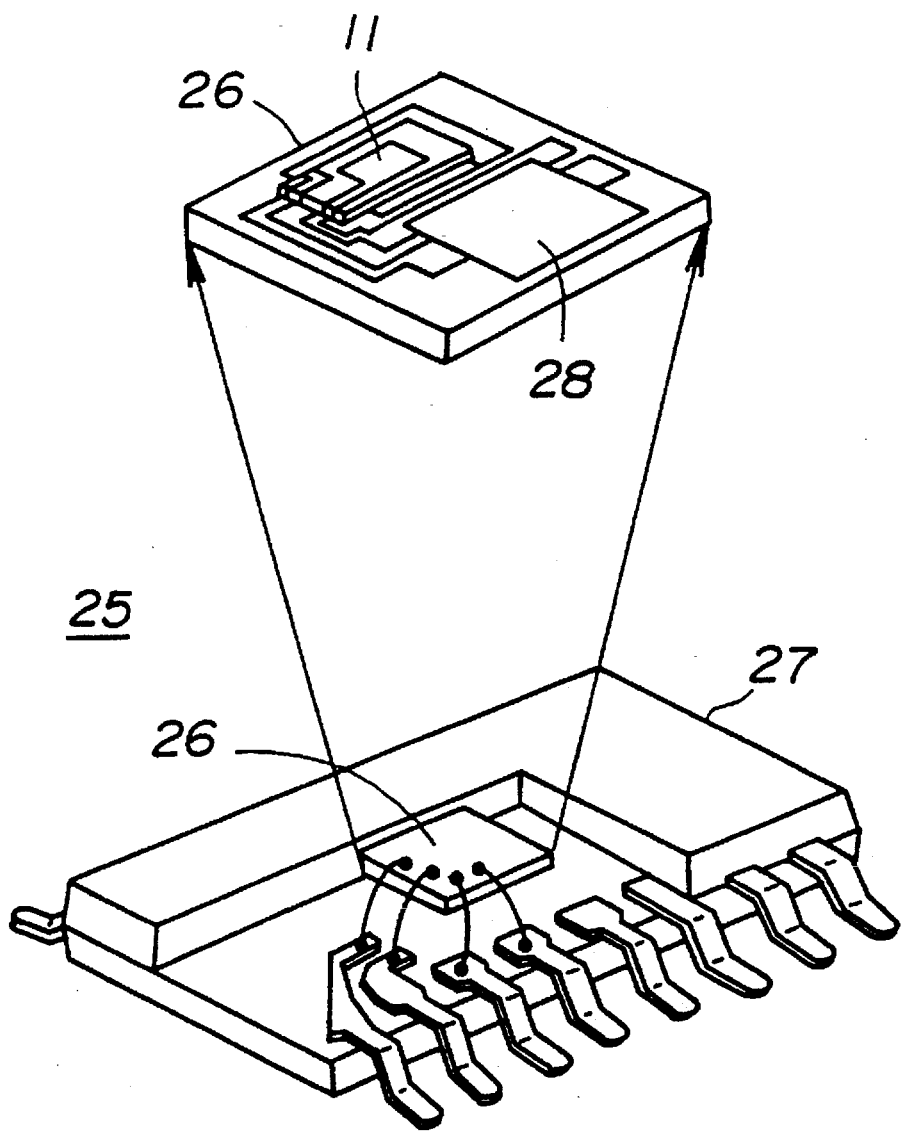
FIG. 3 is a perspective view of the frequency converter shown in FIG. 1 formed in an LSI package.

FIG. 3 shows a perspective view of a frequency converter 25 according to the above-mentioned first embodiment formed in a package used for an LSI device. The frequency converter 25 comprises an IC chip 26 which is molded in a plastic package 27 which is identical to a package used for an ordinary LSI device. The quartz-crystal resonator 11 is mounted on the IC chip 26. A circuit unit 28 comprising all the circuit parts shown in FIG. 1 is also formed on the IC chip 26.

Apparent from the examples shown in FIGS. 2 and 3, a conventional quartz-crystal oscillator can be easily replaced with the frequency converter according to the present invention, and easily mounted to a circuitboard. When a package used for a quartz-crystal oscillator is used, a communication port terminal is used for setting data in the frequency converter, and thereafter the terminal may be cut off so that the frequency converter is compatible with a quartz-crystal oscillator by having the same terminal arrangement with the conventional quartz-crystal oscillator.

Figure 4:
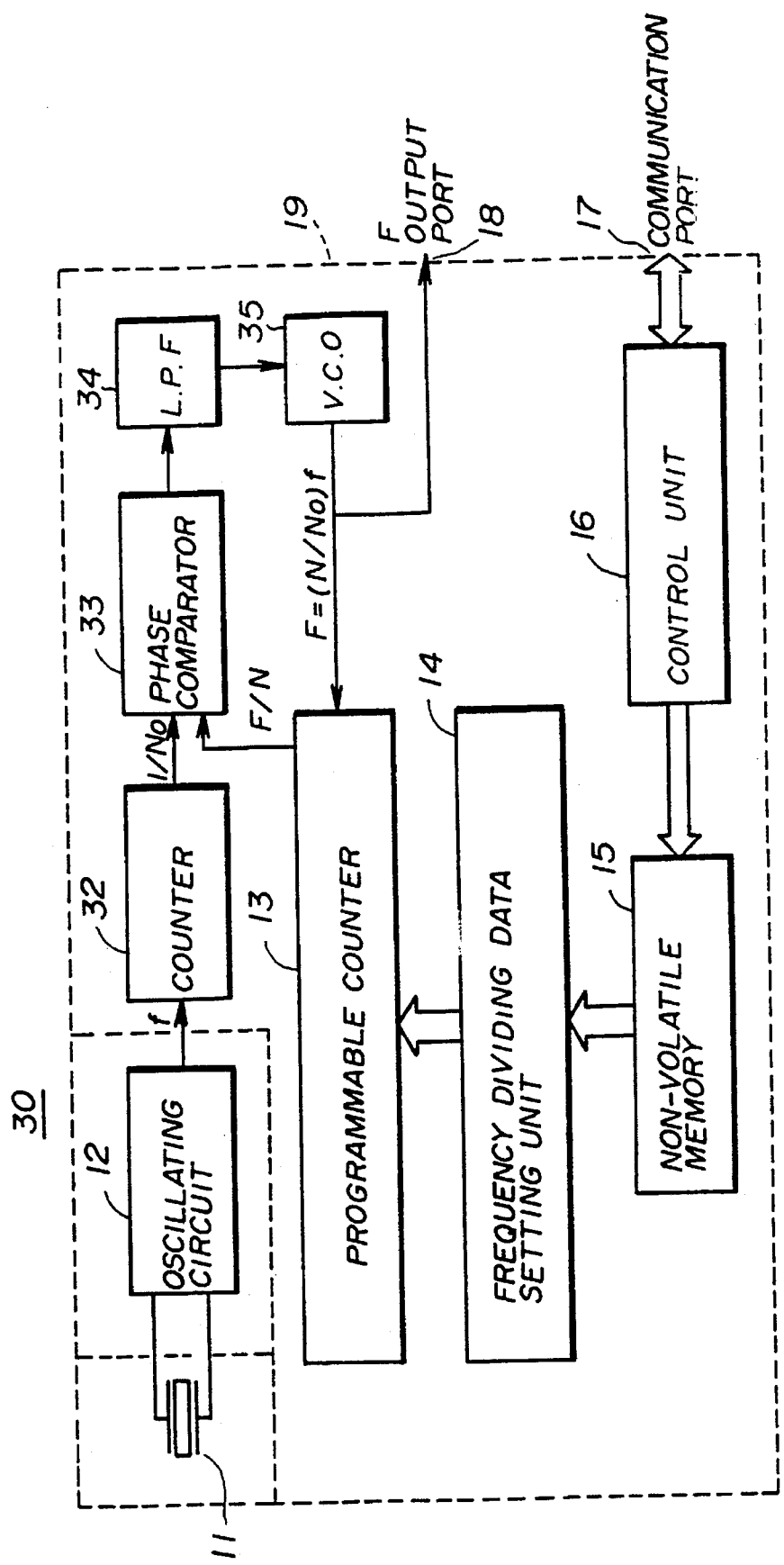
FIG. 4 is a block diagram of a second embodiment of a frequency converter according to the present invention.

A description will now be given, with reference to FIG. 4, of a second embodiment of a frequency converter according to the present invention. FIG. 4 is a block diagram of a second embodiment of a frequency converter according to the present invention. In FIG. 4, parts that are the same as the parts shown in FIG. 1 are given the same reference numerals, and descriptions thereof will be omitted.

As shown in FIG. 4, a frequency converter 30 according to the present invention comprises all the parts included in the above-mentioned first embodiment, and further comprises a counter 32, a phase comparator 33, a low-pass filter (L.P.F) 34 and a voltage controlled oscillator (V.C.O.) 35. Similarly to the first embodiment, the resonator 11 and the oscillating circuit 12 may be provided separately from other parts. The additionally provided parts, that are the counter 32, the phase comparator 33, the low-pass filter (L.P.F) 34 and the voltage-controlled oscillator (V.C.O.) 35 constitute a frequency synthesizer of a PPL control system.

Unlike the first embodiment, a signal having a frequency f generated by the combination of the resonator 11 and the oscillating circuit 12 is supplied to the counter 32. The frequency f is divided by $N_0$ by means of the counter 32, and thus a signal having a frequency $f/N_0$ is output from the counter 32. This signal is input to the phase comparator 33.

On the other hand, the programmable counter 13 divides a frequency F of a signal output from the voltage-controlled oscillator 35 by the frequency dividing ratio N, and outputs a signal having the divided frequency f/N to the phase comparator 33.

The phase comparator compares the signal having the frequency $f/N_0$ with the signal having the frequency F/N, and then outputs a signal corresponding to a phase difference between the frequencies $f/N_0$ and F/N. This signal is input to the low-pass filter 34 so that the signal is converted into a voltage signal of which level corresponds to the phase difference between the frequencies $f/N_0$ and F/N. The voltage signal is then input to the voltage-controlled oscillator 35.

The voltage-controlled oscillator 35 oscillates at a frequency F according to the input voltage signal as a control signal, and outputs a signal having the frequency F. This signal is output from the output port 18, and also is input to the programmable counter 13.

Since the input signals of the phase comparator 33 are rendered to be the same phase, a relationship between the frequency F and the frequency f is expressed as follows.

$$f/N_0 = F/N$$

$$F = (N/n_0) \times f$$

According to the above-mentioned frequency synthesizer system, a frequency signal having high resolution frequency and a wide frequency rage can be obtained as compared to the first embodiment.

In the above-mentioned second embodiment, although the frequency-dividing ratio $N_0$ is a predetermined fixed value, $N_0$ may be varied by providing a programmable counter as the counter 32. In such a case, the frequency-dividing ratio $N_0$ should be stored in a non-volatile memory. In such a case, a higher resolution can be obtained, and the frequency range can be further increased.

Similarly to the first embodiment according to the present invention, the frequency converter 30 can be treated in the same manner as a quartz-crystal oscillator having a specific frequency. Therefore, it is not necessary to manufacture a quartz-crystal resonator for each application. As for the resonator 11, a ceramic resonator may be used for an application in which a less accurate frequency is usable so that an advantage of low manufacturing cost is obtained.

Additionally, similarly to the first embodiment according to the present invention, the package of the above-mentioned second embodiment may be formed as a package used for a quartz-crystal oscillator or a package used for an IC device or an LSI device. In this way, a conventional quartz-crystal oscillator can be easily replaced with the frequency converter according to the present invention, and easily mounted to a circuitboard.

The present invention is not limited to the specifically disclosed embodiments, and variations and modifications may be made without departing from the scope of the present invention.

What is claimed is:

1. A frequency converter comprising:

a programmable counter which outputs a signal having a desired frequency by dividing a frequency of an input signal by a frequency-dividing ratio;

a non-volatile memory, connected to said programmable counter, for storing data for setting the frequency-dividing ratio used by said programmable counter;

a control unit, connected to said non-volatile memory, for controlling a writing operation of data stored into said non-volatile memory;

a package for accommodating said programmable counter, said non-volatile memory and said control unit; and a frequency-dividing setting unit for setting the data for setting the frequency-dividing ratio stored in said non-volatile memory, and wherein the frequency-dividing ratio is automatically set in said programmable counter each time when a power is turned on.

2. The frequency converter as claimed in claim 1, further comprising a communication port via which the data for setting the frequency-dividing ratio is input to said control unit from an external device.

3. The frequency converter as claimed in claim 2, wherein said package is identical to a package used for a quartz-crystal oscillator.

4. The frequency converter as claimed in claim 2, wherein said package is identical to a package used for an IC device.

5. A frequency converter comprising:

a programmable counter which outputs a signal having a desired frequency by dividing a frequency of an input signal by a frequency-dividing ratio;

a non-volatile memory, connected to said programmable counter, for storing data for setting the frequency-dividing ratio used by said programmable counter;

a control unit, connected to said non-volatile memory, for controlling a writing operation of data stored into said non-volatile memory;

a frequency synthesizer which generates a signal having a desired frequency;

a package for accommodating said programmable counter, said non-volatile memory, said control unit, and said frequency synthesizer; and wherein said frequency synthesizer comprises:

a counter which supplies a signal having a second frequency, said second frequency being generated by dividing a frequency of an input signal by a second frequency-dividing ratio;

a phase comparator which compares a first phase of said second frequency of the signal input from said counter with a second phase of the first frequency of the signal input from said programmable counter and outputs a signal corresponding to a phase difference between the first phase and the second phase;

a low-pass filter, connected to the phase comparator, for converting said signal corresponding to the phase difference into a voltage signal having a level corresponding to the phase difference; and a voltage controlled oscillator, connected to said low-pass filter, which oscillates at the desired frequency according to the level of the voltage signal input from said low-pass filter, and outputs a signal having the desired frequency to an output port of said frequency converter and said programmable counter.

6. The frequency converter as claimed in claim 5, wherein said counter comprises a programmable counter.

7. A frequency converter comprising:

a programmable counter which outputs a signal having a desired frequency by dividing a frequency of an input signal by a frequency-dividing ratio;

a non-volatile memory, connected to said programmable counter, for storing data for setting the frequency-dividing ratio used by said programmable counter;

a control unit, connected to said non-volatile memory, for controlling a writing operation of data stored into said non-volatile memory;

a frequency synthesizer which generates a signal having a desired frequency;

a package for accommodating said programmable counter, said non-volatile memory, said control unit, and said frequency synthesizer; and a frequency dividing setting unit for setting the data for setting the frequency-dividing ratio stored in said non-volatile memory, and wherein the frequency-dividing ratio is automatically set in said programmable counter each time when a power is turned on.

8. The frequency converter as claimed in claim 7, further comprising a communication port via which the data for setting the frequency-dividing ratio is input to said control unit from an external device.

9. The frequency converter as claimed in claim 8, wherein said package is identical to a package used for a quartz-crystal oscillator.

10. The frequency converter as claimed in claim 8, wherein said package is identical to a package used for an IC device.

* * * * *